(12) United States Patent
Ichitsubo et al.

(10) Patent No.: US 7,508,261 B2
(45) Date of Patent: Mar. 24, 2009

(54) SYSTEMS OF MINIATURIZED COMPATIBLE RADIO FREQUENCY WIRELESS DEVICES

(75) Inventors: Ikuroh Ichitsubo, Kanagawa Prefecture (JP); Kanya Kubota, Shiga-ken (JP); Masaya Kuwano, Kanagawa Prefecture (JP); Koshiro Matsumoto, Tokyo (JP)

(73) Assignee: Micro-Mobio, Inc., Palo Alto, CA (US)

( * ) Notice: Subject to any disclaimer, the term of this patent is extended or adjusted under 35 U.S.C. 154(b) by 254 days.

(21) Appl. No.: 11/512,634

(22) Filed: Aug. 30, 2006

(65) Prior Publication Data
US 2006/0290423 A1    Dec. 28, 2006

Related U.S. Application Data

(63) Continuation-in-part of application No. 11/039,687, filed on Jan. 19, 2005, now Pat. No. 7,084,702.

(51) Int. Cl.
*H03F 3/68* (2006.01)
(52) U.S. Cl. .................. 330/126; 330/285; 330/296; 330/307
(58) Field of Classification Search .......... 330/126, 330/124 R, 285, 296, 307
See application file for complete search history.

(56) References Cited

U.S. PATENT DOCUMENTS

| | | | |
|---|---|---|---|
| 6,288,612 B1 * | 9/2001 | Ueno et al. .......... | 330/285 |
| 6,455,936 B1 | 9/2002 | Lo et al. | |
| 6,476,500 B2 | 11/2002 | Kimura | |
| 6,489,843 B1 * | 12/2002 | Nishijima et al. ........ | 330/51 |
| 6,734,553 B2 | 5/2004 | Kimura | |
| 6,756,664 B2 | 6/2004 | Yang | |
| 6,847,105 B2 | 1/2005 | Koopmans | |
| 6,861,761 B2 | 3/2005 | Yang et al. | |
| 6,889,429 B2 | 5/2005 | Celaya et al. | |
| 7,098,528 B2 | 8/2006 | Vasishta et al. | |
| 7,141,876 B2 * | 11/2006 | Akamine et al. ....... | 257/728 |
| 7,221,225 B2 * | 5/2007 | Ichitsubo et al. ........ | 330/279 |
| 2003/0089868 A1 | 5/2003 | Ito et al. | |
| 2003/0153122 A1 | 8/2003 | Brooks | |
| 2003/0230796 A1 | 12/2003 | Ismail et al. | |
| 2003/0232462 A1 | 12/2003 | Poo et al. | |
| 2004/0033673 A1 | 2/2004 | Cobbley et al. | |
| 2004/0124539 A1 | 7/2004 | Yang et al. | |
| 2004/0150084 A1 | 8/2004 | Nishida et al. | |

* cited by examiner

*Primary Examiner*—Patricia Nguyen
(74) *Attorney, Agent, or Firm*—Tran & Associates (57) ABSTRACT

A system of compatible modules includes a radio frequency (RF) module with a power amplifier configured to produce an amplified RF signal at an output RF terminal; and a first row of pads and a first column of pads intersecting at a corner pad of the module, and wherein the corner pad is coupled to the output RF terminal.

19 Claims, 11 Drawing Sheets

SYSTEMS OF MINIATURIZED COMPATIBLE RADIO FREQUENCY WIRELESS DEVICES

RELATED APPLICATION

The present invention is continuation-in-part of U.S. application Ser. No. 11/039,687 filed on Jan. 19, 2005 now U.S. Pat. No. 7,084,702 entitled "MULTI-BAND PA MODULE FOR WIRELESS COMMUNICATION DEVICES" and related to the commonly assigned U.S. patent application Ser. No. 10/041,863, titled "Multilayer RF Amplifier Module" by Wang, et al., filed on Oct. 22, 2001, U.S. patent application Ser. No. 10/385,058, titled "Power amplifier Module for wireless communication devices" by Ichitsubo et al, filed on Mar. 9, 2003, U.S. patent application Ser. No. 10/385,059, titled "Accurate Power Sensing Circuit for Power Amplifiers by Ichitsubo et al, filed on Mar. 9, 2003, U.S. patent application Ser. No. 10/804,737, titled "RF front-end module for wireless communication devices" by Ichitsubo et al., filed Mar. 18, 2004, U.S. patent application Ser. No. 10/972,858, titled "Frequency filtering circuit for wireless communication devices" by Kubota et al, filed Oct. 25, 2004, filed and U.S. patent application Ser. No. 10/972,636, titled "Diplexer circuit for wireless communication devices" by Kubota et al, filed Oct. 25, 2004. The disclosures of these applications are hereby incorporated by reference.

BACKGROUND

The present invention relates to radio frequency (RF) power amplifiers (PA) module. Portable devices such as laptop personal computers (PC), Personal Digital Assistant (PDA) and cellular phones with wireless communication capability are being developed in ever decreasing size for convenience of use. Correspondingly, the electrical components thereof must also decrease in size while still providing effective radio transmission performance. However, the substantially high transmission power associated with RF communication increases the difficulty of miniaturization of the transmission components.

A major component of the wireless communication device is the radio frequency PA. The PA is conventionally in the form of a semiconductor integrated circuit (IC) chip or die in which signal amplification is effected with substantial power. The amplifier chip is interconnected in a circuit with certain off-chip components such as inductors, capacitors, resistors, and transmission lines used for controlling operation of the amplifier chip and providing impedance matching of the input and output RF signals. The amplifier chip and associated components are typically assembled by interconnected metal circuit and bond wires on a printed circuit board (PCB) having a dielectric substrate or a lead frame.

Among significant considerations in the miniaturization of RF amplifier circuits is the required impedance matching for the input and output RF signals of the amplifier. Input and output impedance matching circuits typically include capacitors, resistors, and inductors in associated transmission lines or micro strips for the RF signals into and out of the amplifier chip. However, these impedance matching circuits may require specifically tailored off-chip components located around the amplifier IC chip. Accordingly, the application circuitry must include many electrical input and output terminals or bonding pads to which the corresponding portions of the off-chip impedance matching circuits are separately joined. This increases the difficulty of assembly and required size of the associated components, and affects the overall manufacturability of the portable devices.

One important requirement for the state-of-the-art wireless devices is to provide power amplification in a plurality of frequency bands. The quality and power level of the amplified RF signals need to be properly controlled. The amplification of RF signals is required to be linear over a wide signal power range in each of the plurality of frequency bands. Preferably the amplification is reduced or increased according to input RF signal, transmittance range and data rate so that power consumption can be optimized.

SUMMARY

In a first aspect, a radio frequency (RF) module includes a power amplifier configured to produce an amplified RF signal at an output RF terminal; and a row of pads and a column of pads intersecting at a corner pad of the module, and wherein the corner pad is coupled to the output RF terminal.

Implementations of the above aspect may include one or more of the following. The input and output terminals can be positioned on the row of pads. The row of pads can be an RF input terminal, a bias control terminal, a power control terminal, a power sensor output terminal, an RF output terminal, a current sensing terminal. A ground plane can be positioned adjacent to the row and column of pads. The column of pads can be one or more power supply input terminals. The pads can be foot-print compatible with a second RF module having a different number of pads when the modules are aligned at a corner pad. The second RF module can include a second power amplifier having an RF output coupled to a corner pad of the second RF module. The power amplifier and the second power amplifier can receive RF inputs from corresponding RF input pads occupying the same offset from the corner pad when the modules are aligned at the corner pad. The second RF module can have a different number of pads than the first module and wherein the row and column of pads of the second RF module physically correspond to the row and column of pads of the RF module.

In another aspect, a system of compatible modules includes a first module including: first and second rows of pads positioned on adjacent sides of the module and intersecting at a first corner pad, said first and second rows of pads coupled to the a power amplifiers and first and second bias circuits and separated by a predetermined center-to-center spacing; and a second module including third and fourth rows of pads positioned on adjacent sides of the module and intersecting at a second corner pad, the third and fourth row pad having the predetermined center-to-center spacing and different dimensions than dimensions of the first and second row pad, wherein the third and fourth rows of pads of the second module fit with the first and second rows of pads of the first module to provide interchangeability.

In yet another aspect, a system of compatible modules has a first module including a first power amplifier configured to amplify a first input radio frequency signal in a first frequency band in response to a first bias control signal to produce a first output radio frequency signal; a first bias circuit configured to output the first bias control signal; and first and second rows of pads positioned on adjacent sides of the module and intersecting at a corner pad, said first and second rows of pads coupled to the first power amplifier and first bias circuit and separated by a predetermined center-to-center spacing. The system also has a second module including a second power amplifier configured to amplify a first input radio frequency signal in a first frequency band in response to a first bias control signal to produce a first output radio frequency signal; a second bias circuit configured to output the first bias control signal; third and fourth rows of pads positioned on adjacent sides of the module and intersecting at a corner pad, the third and fourth row pad having the predetermined center-to-center spacing and different dimensions than dimensions of the first and second row pad, said third and fourth rows of pads coupled to the second power amplifier and second bias circuit, wherein the third and fourth rows of pads of the second module fit with the first and second rows of pads of the first module to provide interchangeability.

In yet another aspect, a multi-band power amplifier module includes a first power amplifier configured to amplify a first input radio frequency signal in a first frequency band in response to a first bias control signal to produced a first output radio frequency signal; a first bias circuit configured to output the first bias control signal in response to the first step gain signal at the step gain terminal; a second power amplifier configured to amplify a second input radio frequency signal in a second frequency band in response to a second bias control signal to produced a second output radio frequency signal; a second bias circuit configured to output the second bias control signal in response to the second step gain signal at the step gain terminal, and first and second rows of pads positioned on adjacent sides of the module and intersecting at a corner pad, said first and second rows of pads coupled to the first and second power amplifiers and first and second bias circuits, wherein a contiguous subset of the first and second rows of pads corresponds to contiguous first and second rows of pads of a the single band power amplifier module.

In another aspect, the present application relates to a multi-band power amplifier module, comprising: a power sensing terminal configured to receive a first power sensing signal and a second power sensing signal; a first power amplifier configured to amplify a first input radio frequency signal in a first frequency band in response to the first power sensing signal to produced a first output radio frequency signal; a first power sensing circuit configured to output the first power sensing signal at the power sensing terminal; a second power amplifier configured to amplify a second input radio frequency signal in a second frequency band in response to the second power sensing signal to produced a second output radio frequency signal; and a second power sensing circuit configured to output the second power sensing signal at the power sensing terminal. The module has first and second rows of pads positioned on parallel sides of the module and intersecting at a corner pad, said first and second rows of pads coupled to the first and second power amplifiers and first and second bias circuits, wherein a contiguous subset of the first and second rows of pads corresponds to contiguous first and second rows of pads of a the single band power amplifier module.

An advantage of the present invention is that the modules are interchangeable. A lower cost device can be used in place of a higher cost device using the same PCB layout. The decision for using a particular device can be delayed until the late during the manufacturing phase (just before soldering the device on a PCB). Such flexibility allows a manufacturer to quickly customize a particular product for performance or for low cost. Although one set of exemplary dimensions are described in the description and in the drawings, other suitable dimensions can be used. Also, the system includes more than two devices. For example, from one to ten interchangeable devices can be offered by the system. The power amplifier is capable of amplifying radio frequency signals in a plurality of frequency bands with efficient circuit. The power amplifier modules include power sensing circuits and bias control circuits that optimally control the bias current and operation characteristics of the power amplifiers. As a result, the quality, the linearity, and current consumption of the amplified signals are significantly improved across a plurality of frequency bands over a wide dynamic range. The frequency range can cover from several megahertz (MHZ) to tens of gigahertz (GHZ).

The power sensing bias control circuits for different power amplifiers operating at different frequency bands can be integrated within the RF amplifier module. In particular, the power sensing and the bias control terminals can be shared among different power amplifiers to reduce foot print of the power amplifier module. The integrated RF amplifier module is therefore compact and lower cost.

A plurality of power supply terminals can be provided to supply power to each power amplifier. The flexibility of providing power from one or more power supply terminals enables greater amount power being supplied to the power amplifiers, which is crucial for wireless applications requiring high power amplification for WiFi and WiMax applications. In another application one or more power supply terminals can be used for current-sensing that is directly proportional to the supply current. In particular, high-speed current sensing is a common problem faced by designer with some significant challenges, which can increase the junction temperature rapidly; current-sensing feature eliminates the problems.

The power amplifier circuit can be fabricated on semiconductor materials such as Gallium Arsenide Heterojunction Bipolar Transistors (GaAs HBT). The RF power amplifier module can include a multi-layer three-dimensional substrate or a lead frame having a bottom metal layer adapted to bond with the printed circuit board (PCB) of a wireless communication device. The substrate can include one or more upper layers adapted to receive the amplifier chip and other off-chip components. The bottom layer includes grounding metal pads that are located at the center and at each corner, which is registered and adapted to bond with the circuit pattern on PCB of the wireless communication device. The metal pads are connected to the upper layers through the multilayer three-dimensional substrate by a plurality of metal via holes.

The RF amplifier module is suitable to applications in various wireless data and voice communications standards and protocols, including Global System for Mobile Communications (GSM), General Packet Radio Service (GPRS), Code Division Multiple Access (CDMA), Wideband CDMA, Universal Mobile Telecommunications System (UMTS), IEEE 802.11 (WiFi), IEEE 802.16 (WiMax), and others. The PA module in accordance to the present invention especially provides reliable amplification to the WiFi and WiMax applications.

Additional features and advantages of the invention will be set forth in the description, which follows, and in part will be obvious from the description, or may be learned by the practice of the invention. The features and advantages of the invention may be realized and obtained by means of the instruments and combinations particularly pointed out in the appended claims. These and other features of the present invention will become apparent from the following description and appended claims, or may be learned by the practice of the invention as set forth hereinafter.

BRIEF DESCRIPTION OF THE DRAWINGS

The accompanying drawings, which are incorporated in and form a part of this specification, illustrate embodiments of the invention and, together with the description, serve to explain the principles of the invention:

FIGS. 8A-8B and 8C-8D show two exemplary devices that are foot-print compatible, while

DESCRIPTION OF INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1:
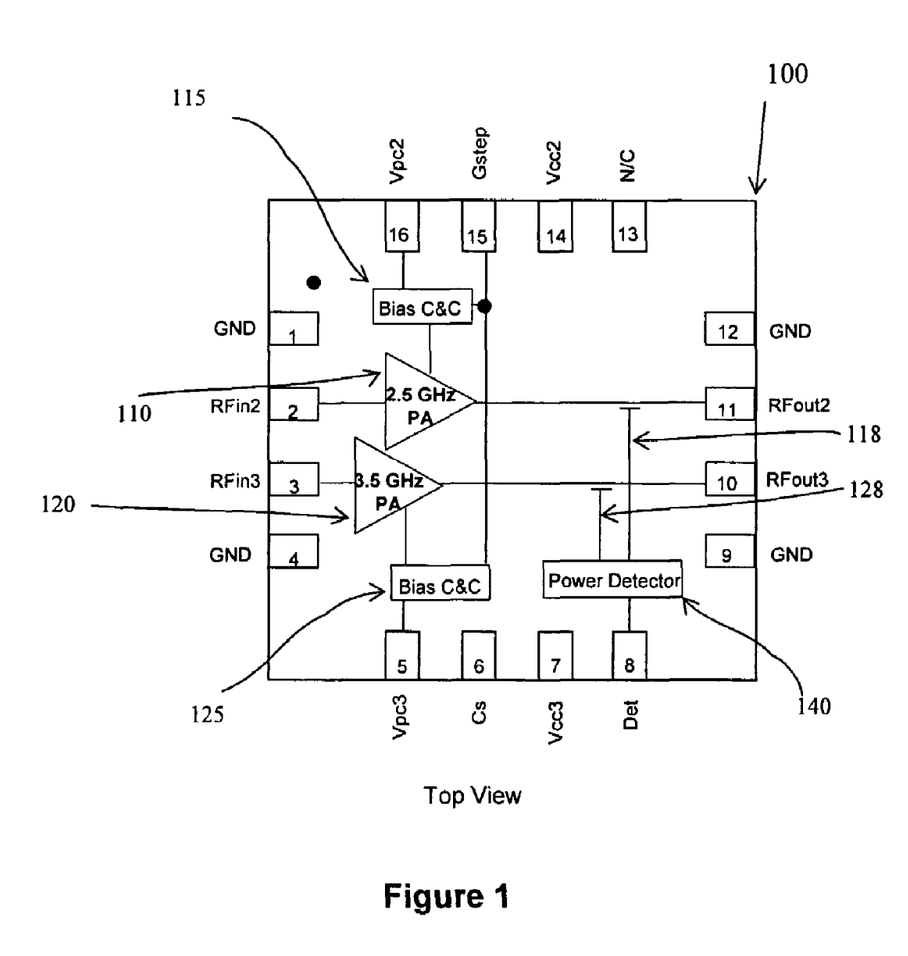
FIG. 1 illustrates a top view diagram of a power amplifier module capable of amplifying radio frequency signals at two radio frequency bands in accordance to an embodiment of the present invention.

As shown in FIG. 1, a power amplifier module 100 provides a unitary or common component that may be conveniently assembled in wireless devices such as cellular phone, mobile computers, handheld wireless digital devices, and for 3G, WiFi and WiMax applications. In the present invention, the term "module" refers to such a unitary device for wireless communications, comprising integrated power amplifiers and other circuitry and auxiliary electronic components. The power amplifier module 100 is capable of amplifying radio frequency signals in a plurality of frequency bands. As shown in the top view diagram of FIG. 1, the power amplifier module 100 comprises a first power amplifier 110 and a second power amplifier 120. For example, the first power amplifier 110 can amplify radio frequency signals in a frequency band centered around 2.5 GHz. The second power amplifier 120 can amplify radio frequency signals in a frequency band centered around 3.5 GHz. The power amplifier module 100 is compatible with other radio frequencies such as 400 MHz, 700 MHz, and 1-5 GHz, etc.

The power amplifier module 100 includes four sides and a plurality of metal electrodes (often referred as pads, pins or terminals) along each side. The pads, pins or terminals can provide RF signal input and control signal input to the power amplifiers as well as output RF or power sensing signals. As shown in FIG. 1, the power amplifier module 100 includes an input side on the left having pins 1 and 4 as ground, and pin 2 (RFin2) and pin 3 (RFin3) respectively for receiving input RF signals for the first power amplifier 110 and the second power amplifier 120. The power amplifier module 100 also includes an output side on the right having pins 9 and 12 as ground, and pin 11 (RFout2) and pin 10 (RFout3) respectively for receiving output RF signals from the first power amplifier 110 and the second power amplifier 120. The upper side of the power amplifier module 100 includes pin 16 (Vpc2) for receiving input signals to bias control circuit 115 for the first power amplifier 110. The lower side of the power amplifier module 100 includes pin 5 (Vpc3) for receiving input signals to bias control circuit 125 for the second power amplifier 120.

In accordance with one embodiment of the present invention, pin 15 (Gstep or gain step) along the upper side of the power amplifier module 100 receives step gain signals for both the bias control circuit 115 and the bias control circuit 125. The amplified RF signals output from the first power amplifier 110 and the second power amplifier 120 can be detected respectively by power coupling 118 and 128. In response, a power detecting circuit 140 produces power detector signals at pin 8 (Det). Since only one of the two power amplifiers 110 and 120 are in operation at each time, the power detector signals from the two power amplifiers 110 and 120 can be output at a shared terminal at Det pin. The sharing of the power sensing terminal at Det pin and the step gain control terminal at Gstep pin reduces the number of pins, the footprint, and manufacturing cost of the power amplifier module 100.

The upper side of the amplifier module 100 includes a power supply pins 14 (Vcc2) and a N/C pin which can be reserved for power current sensing, while the lower side of the amplifier module 100 also includes a power supply pin 7 (Vcc3). In certain applications, DC power is fed to the power amplifier circuits by both Vcc2 and Vcc3. In yet another occasion, the DC power is fed to the 2.5 GHz and 3.5 GHz power amplifiers, either Vcc2 or Vcc3, respectively. In other applications, the reserved N/C pin is adapted to senses the DC current supplied to the PA. The DC current sensing output can be used to safely reduce the input to PA or shut down the PA when over-current is detected.

Figure 2:
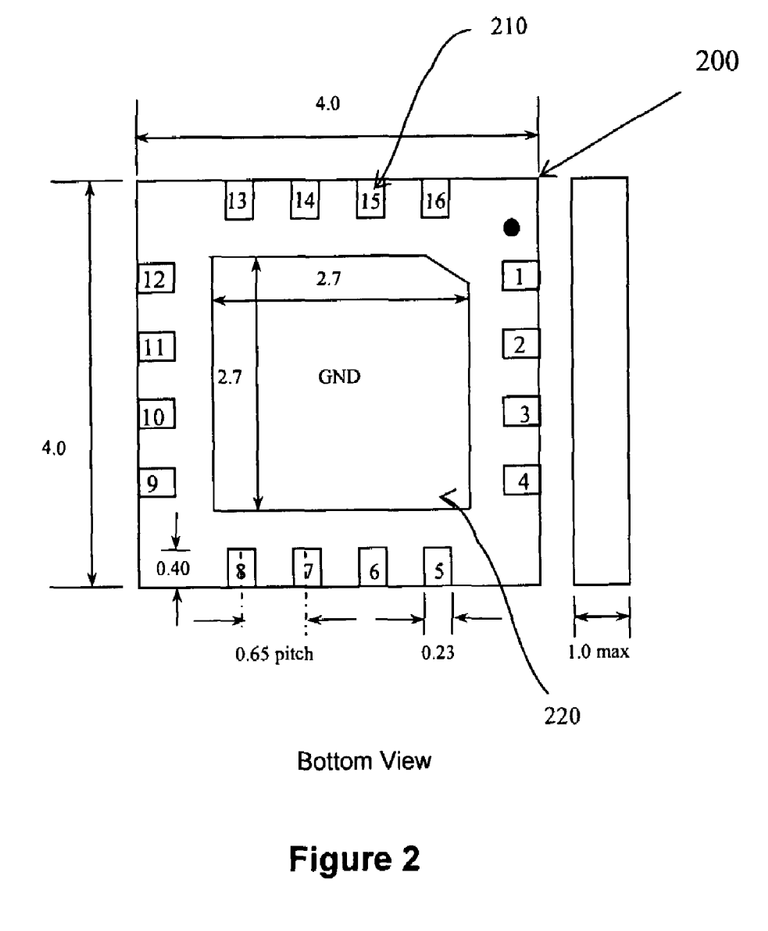
FIG. 2 is a bottom view of electrical layout of the power amplifier module of FIG. 1.

The bottom view of the power amplifier module 100 is shown in FIG. 2. The pin-out 200 of the power amplifier module 100 when viewed from the bottom is flip symmetry of the pin-out when viewed from the top. Exemplified dimensions are also labeled in FIG. 2 in millimeter) to show the small foot print of the power amplifier module 100 which are achieved by integrated circuit designs and shared electrodes between the power amplifiers for different frequency bands.

The power amplifier module 100 can further comprise frequency filter circuits and diplexers that can receive the input radio frequency signals and output a radio frequency signal at a selective frequency (e.g. one of 2.5 GHz and 3.5 GHz). Details of frequency circuit and diplexer are disclosed in the above referenced and commonly assigned U.S. patent application Ser. No. 10/972,858, titled "Frequency filtering circuit for wireless communication devices" by Kubota et al, filed Oct. 25, 2004, filed and U.S. patent application Ser. No. 10/972,636, titled "Diplexer circuit for wireless communication devices" by Kubota et al, filed Oct. 25, 2004, the disclosures of which are hereby incorporated by reference.

Figure 3:
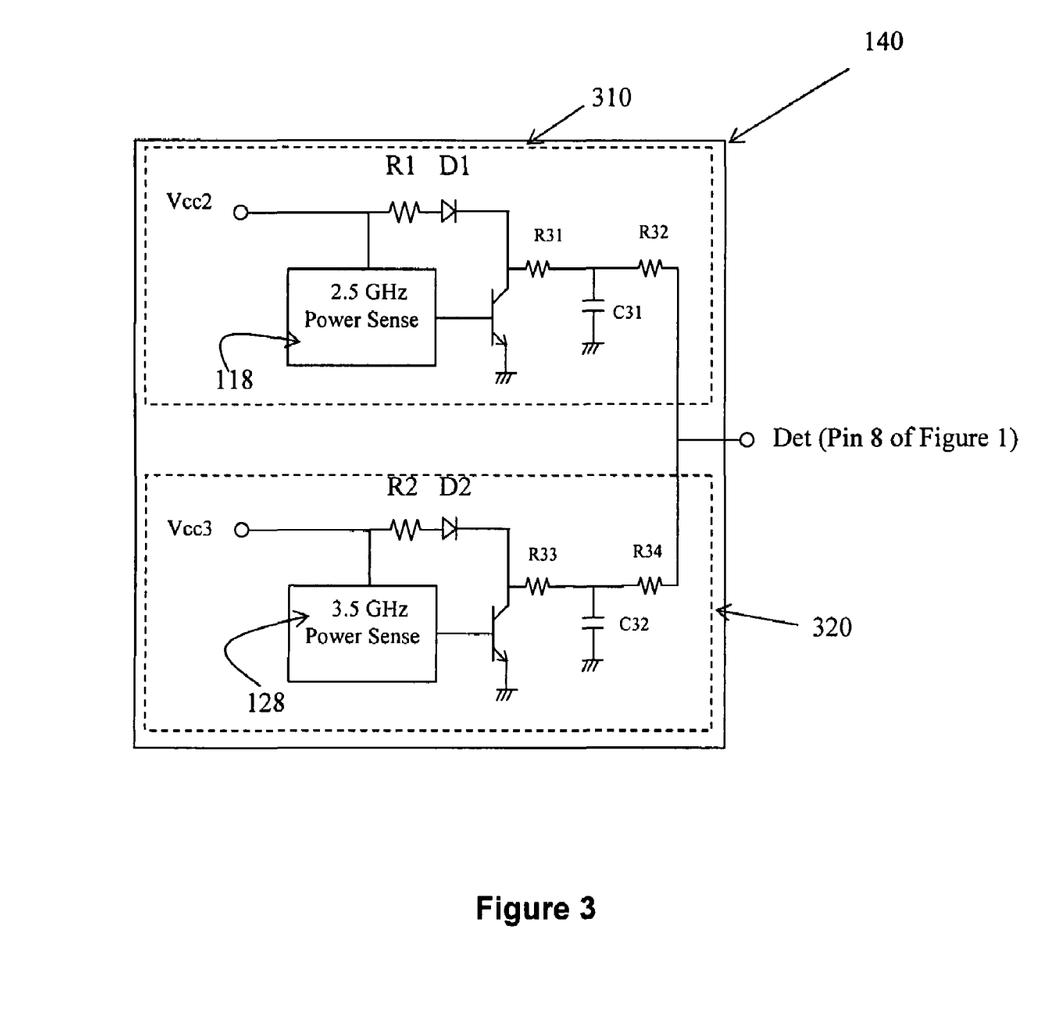
FIG. 3 illustrates power-sensing circuits for the two power amplifiers sharing the same terminal for power sensing output.

FIG. 3 illustrates power-sensing circuit 140 that is configured to detect amplified RF signals output from the first and the second power amplifiers 110 and 120. The power sensing circuit 140 includes a first power sensing circuit 310 and a second power sensing circuit 320. The first power sensing circuit 310 receives the amplified RF signals output from the first power amplifier 110 detected by power coupling 118. The power coupling can be achieved by capacitance, inductive, or other electro-magnetic means. The detected amplified RF signals are amplified by a transistor through the coupling of a resistor R1 and diode D1. The high frequency detector signals are filtered by a RC circuit to the power detector (Det) pin of the power amplifier module 100 (shown in FIG. 1). The amplified RF signals from the second power amplifier 120 are similarly detected, amplified, filtered by another RC circuit and connected to the same Det pin of the power amplifier module 100 in FIG. 1.

Diodes D1 and D2 in the first power sensing circuit 310 and a second power sensing circuit 320 are critical in preventing undesirable reverse coupling of signals from the power sensing output PS pin back to the amplifier output circuits. As a result, power-sensing circuits are integrated between different frequency bands to enable small device footprint without introducing cross-band interference.

Figure 4:
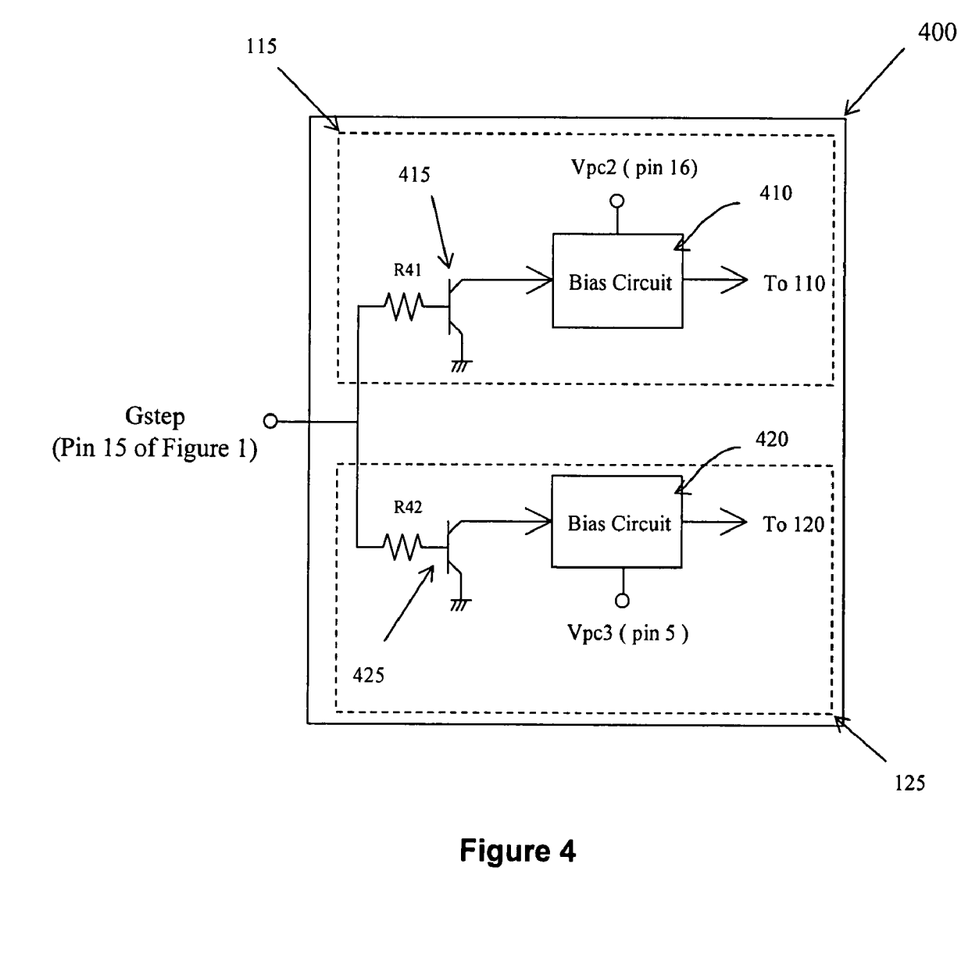
FIG. 4 illustrates bias control circuits for the two power amplifiers sharing the same step gain terminal.

FIG. 4 shows the bias control circuit 400 that includes the bias control circuit 115 and the bias control circuit 125 respectively controlling the bias voltages of the first power amplifier 110 and the second power amplifier 120 for amplifying RF signals in the two frequency bands (e.g. 2.5 GHz and 3.5 GHz). The first bias circuits 410 receive DC power at Vpc2 (pin 16 of FIG. 1). The second bias circuits 420 receive DC power at Vpc3 (pin 5). The bias circuit 400 receives a gain control signal at gain control (pin 15). The gain control signal is coupled with the first bias circuits 410 by a switch circuit that comprises a resistor R41 and a transistor 415. The gain control signal is coupled with the second bias circuits 420 by a switch circuit that comprises a resistor R42 and a transistor 425.

The first power amplifier 110 is integrated with a bias control circuit 115 and a power sensing circuit 140. The bias control circuit 115 is configured to output a first bias control signal and a second bias control signal depending on the voltage value of the gain control signal at step gain (pin 15). The first power amplifier 110 amplifies the input radio frequency signals by a first gain in response to the first bias control signal and by a second gain in response to the second bias control signal. The multiple bias control signals and multiple gains are designed to broaden the dynamic gain range for the power amplifier module 100. For example, the range of the gain for each of the first gain and the second gain can cover a range of 20 db. The first gain can be 20 db or higher than the second gain. The amplification at each of the first gain and the second gain can be referred to as an amplification mode. For example, the power amplifier 110 can perform at a low gain amplification mode and a high gain amplification mode. The bias control circuit 125 is similarly configured to output a first bias control mode and a second bias control mode to control the gains of the second power amplifier 120 for amplifying radio frequency signals at 3.5 GHz.

In another embodiment, the bias control circuit 115 or the bias control circuit 125 can output three bias control modes. The three additive amplification modes can be realized using the two-bit (2-bit) control signals Vpc and Gstep. The 2-bit control signal supports three gain modes and one shutdown mode. The bias control mode can control the first power amplifier 110 to amplify the input radio frequency signals by a different gain. The first gain can be 20 db or higher than the second gain. The second gain can be 20 db or higher than the third gain. The three amplification modes of amplification can realize an amplification range of 40 dB or more. Similarly, a bias circuit can output four or more bias control signals to enable the power amplifier to realize an amplification range of 60 db or more.

Other details of the operations of the bias control circuits 115 and 125 and power sensing circuit 140 as well as the design and benefits of the electric grounding in wireless power amplifier modules are disclosed in the commonly assigned and the above mentioned U.S. patent application Ser. No. 10/041,863, titled "Multilayer RF Amplifier Module" by Wang, et al., filed on Oct. 22, 2001, U.S. patent application Ser. No. 10/385,058, titled "Power amplifier Module for wireless communication devices" by Ichitsubo et al, filed on Mar. 9, 2003, U.S. patent application Ser. No. 10/385,059, titled "Accurate Power Sensing Circuit for Power Amplifiers by Ichitsubo et al, filed on Mar. 9, 2003, U.S. patent application Ser. No. 10/804,737, titled "RF front-end module for wireless communication devices" by Ichitsubo et al., filed Mar. 18, 2004. The disclosures of these applications are incorporated herein by reference.

Figure 5:
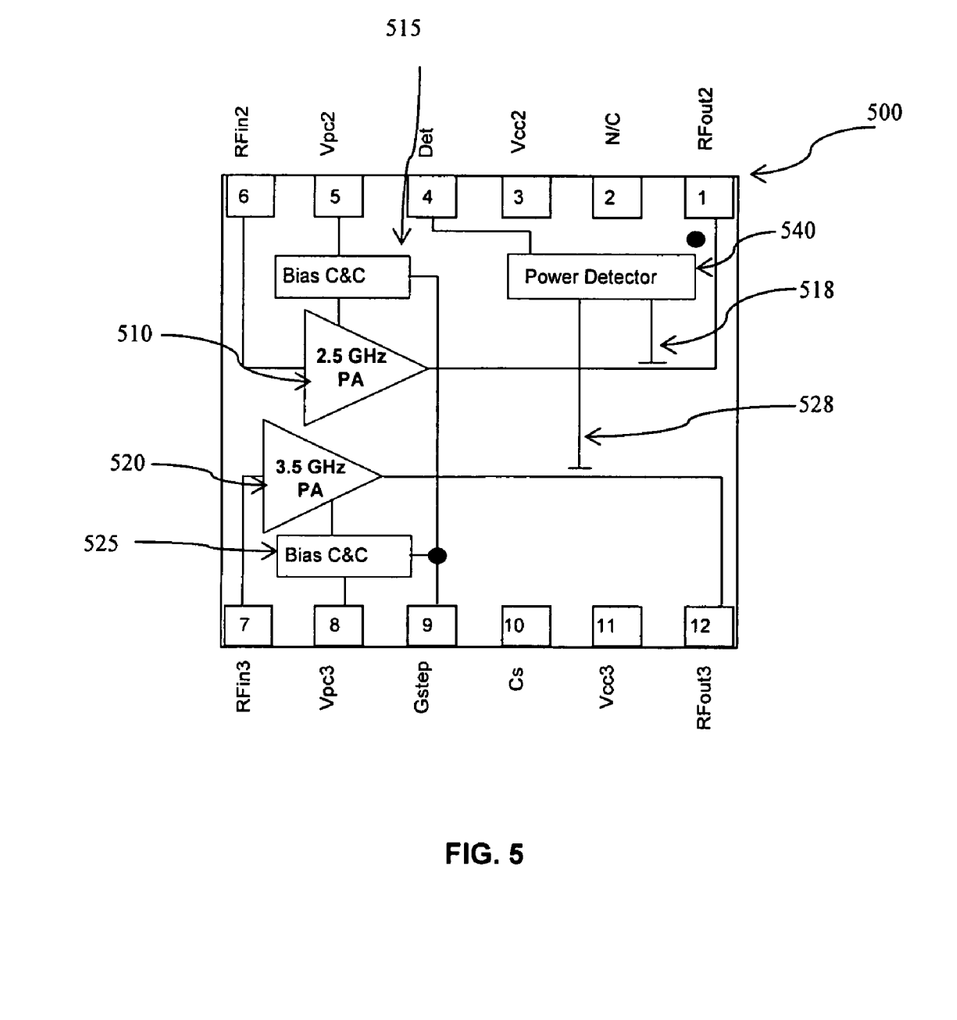
FIG. 5 shows a second embodiment of a dual power amplifier device.

FIG. 5 shows a second embodiment of a dual power amplifier module or device 500. As in FIG. 1, two power amplifiers 510 and 520 are provided. The input and output pins for the device 500 are arranged on parallel sides of the device 500. Thus, pin 6 (RFin2) receives an RF input for the PA 510. Pin 5 (Vpc2) receives a bias control signal for the bias control circuit 515 of the PA 510. Pin 3 (Vcc2) receives DC power, while pin 4 (Det) receives the output of a power detector 540. The output of PA 510 is presented at pin 1 (RFout2). Correspondingly, pin 7 (RFin3) is the RF input for PA 520 and pin 12 (RFout3) is the output of PA 520. Pin 8 (Vpc3) is connected to a bias control circuit 525, which in turn controls the PA 520. Pin 9 (Gstep) receives a gain step control signal which is provided to both bias control circuits 515 and 525. Pin 11 (Vcc3) is connected to the power supply.

Figure 6:
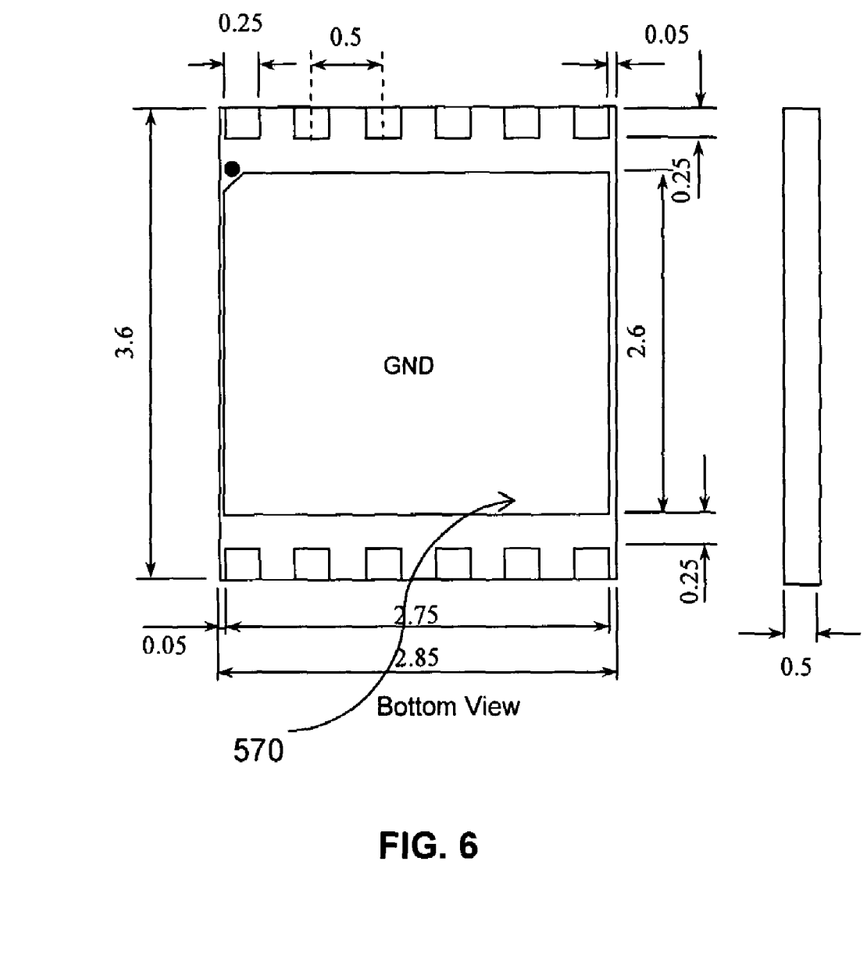
FIG. 6 shows exemplary dimensions for one embodiment of FIG. 5.

FIG. 6 shows exemplary dimensions for one embodiment of FIG. 5. In this embodiment, the power amplifier module 500 is characterized by substantially reduced dimensions. The module is approximately 3.6 mm long, 2.85 mm wide, and 0.5 mm thick as indicated in FIG. 6. The center ground plane 570 on the bottom side of the module is about 2.6 mm by 2.75 mm. Moreover, the pad dimension is about 0.25 mm by 0.25 mm, with inter-pad separation of 0.5 mm from center to center.

Figure 7:
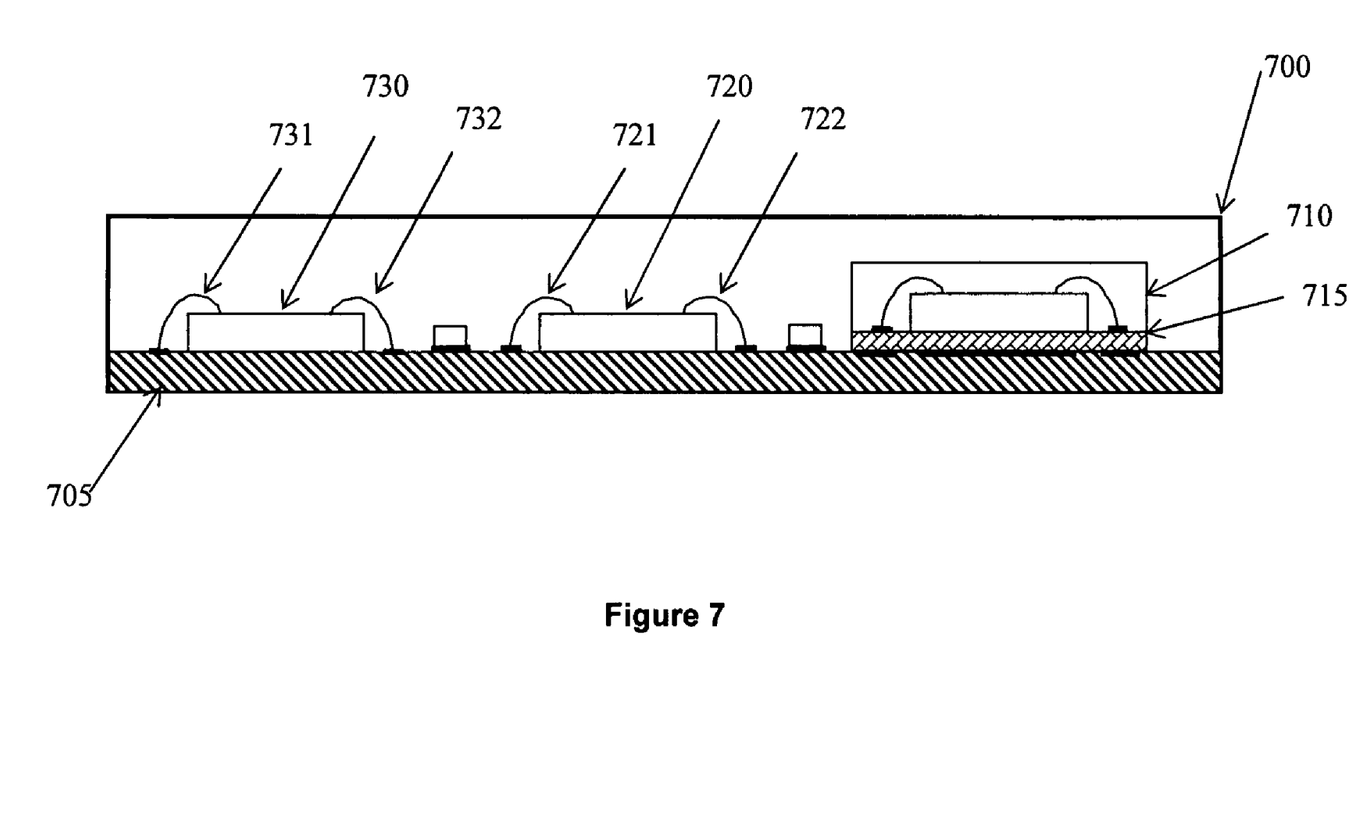
FIG. 7 shows an exemplary cross-sectional view of an embodiment of a System-in-Package embedding a prepackaged power amplifier.

FIG. 7 shows an exemplary cross-sectional view of one embodiment of a power amplifier embedded in a system in a package. A wireless communication device 700 shown in FIG. 7 includes a substrate 705, a prepackaged power amplifier module 710, a radio frequency transceiver 720, and a base band digital signal processor 730. The prepackaged power amplifier module 710, a radio frequency transceiver 720, and a base band digital signal processor 730 are mounted on the substrate 705. The radio frequency transceiver 720 can up-convert electric signals from the base band digital signal processor 730 to radio frequency signals to be amplified by the prepackaged power amplifier module 710. The wireless communication device 700 can further include an antenna and TX/RX switch that can transmit wireless signals in response to the amplified radio frequency signals.

The antenna coupled with the TX/RX switch can also receive wireless signals to convert them to radio frequency signals. The radio frequency transceiver 720 can down-convert the radio frequency signals to low frequency electric signals to be processed by the base band digital signal processor 730.

The radio frequency transceiver 720 and the base band digital signal processor 730 can be bare die chips that are mounted to the substrate 705. The radio frequency transceiver 720 and the base band digital signal processor 730 can be electrically connected to each other and other electronic components in wireless communication device 700 by bond wires 721, 722, 731, 732. The radio frequency transceiver 720 and the base band digital signal processor 730 may be tested on wafer before the assembling to the wireless communication device 700.

The prepackaged power amplifier module 710 includes a substrate 715 that allows it to be integrated into the wireless communication device 700. The substrate 715 includes electric interconnects with the terminals in the power amplifier. The substrate 715 can include a multiplayer printed circuit board (PCB), a lead frame, and lower-temperature co-fired ceramics (LTCC). The substrate 705 in the wireless communication device 700 includes electric interconnects that match the electric interconnects in the substrate 715 in the prepackaged power amplifier module 710. The prepackaged power amplifier module 710 can be plugged and readily bonded to the substrate 715.

The wireless communication device 700 is a packaged device that comprises a prepackaged power amplifier module 710. The prepackaged power amplifier module can be the power amplifier 100 of FIG. 1 or the power amplifier 500 of FIG. 5 or the power amplifier modules of FIG. 9. In the electronic technologies, the wireless communication device 700 can be categorized as Package in Package (PiP) or System in Package (SiP).

The prepackaged power amplifier module 710 includes all the proper electric terminals for in situ operation testing with radio frequency signals. The electric terminals can be electrically connected by wire bonding to the electric contacts on the die in the prepackaged power amplifier module 710. The prepackaged power amplifier module 710 can include impedance matching circuits for input and output RF signals with impedance at 50 ohm. The prepackaged power amplifier module 710 can also include electric terminals for power supply, biasing control, and power sensing.

With the smaller foot print and thinner thickness compared to prior art implementations, the prepackaged amplifier module 500, 700 and 800 are ideal for miniaturized device applications. The modules can be RF Front End Modules including a power amplifier, a low noise amplifier (LNA), and an antenna TX/RX switch.

The modules can be used in a wireless communication device such as a cellular phone, mobile computers, handheld wireless digital devices, a WLAN adaptor, and other wireless electronic devices. The wireless communication device 500 can be compatible with cellular wireless communication standards such as 2G, 2.5G, 3G and 3.5G including Global System for Mobile Communications (GSM), General Packet Radio Service (GPRS), EDGE, Code Division Multiple Access (CDMA), Wideband CDMA, TD-SCDMA, Universal Mobile Telecommunications System (UMTS), etc., WiFi wireless communication standards such as IEEE 802.11, and WiMax wireless communication standards such as IEEE 806.12, and others.

Figure 8A:
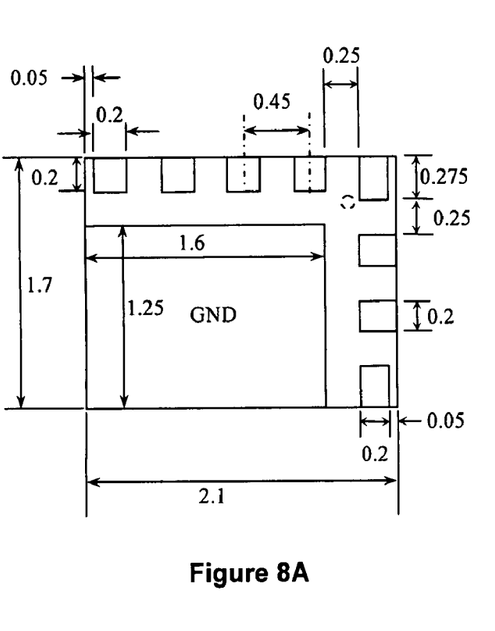
Figure 8B:
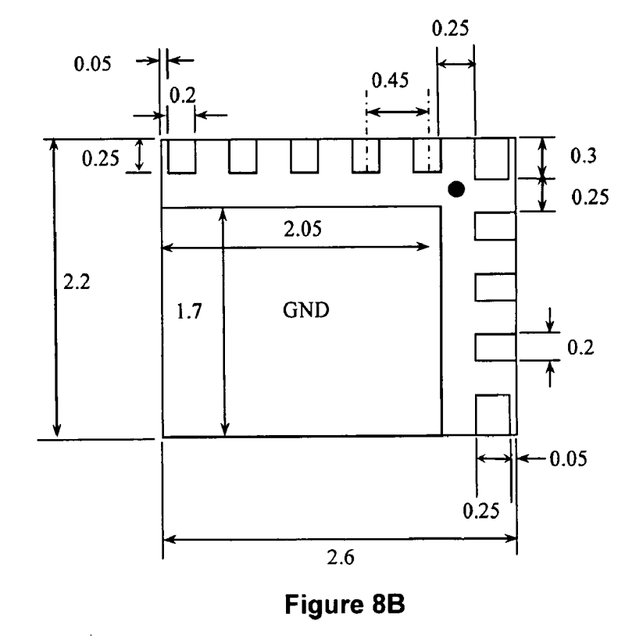
Figure 8C:
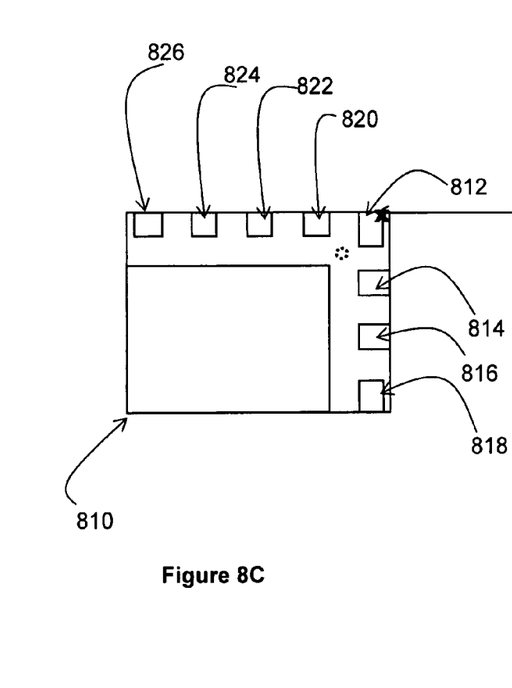
Figure 8D:
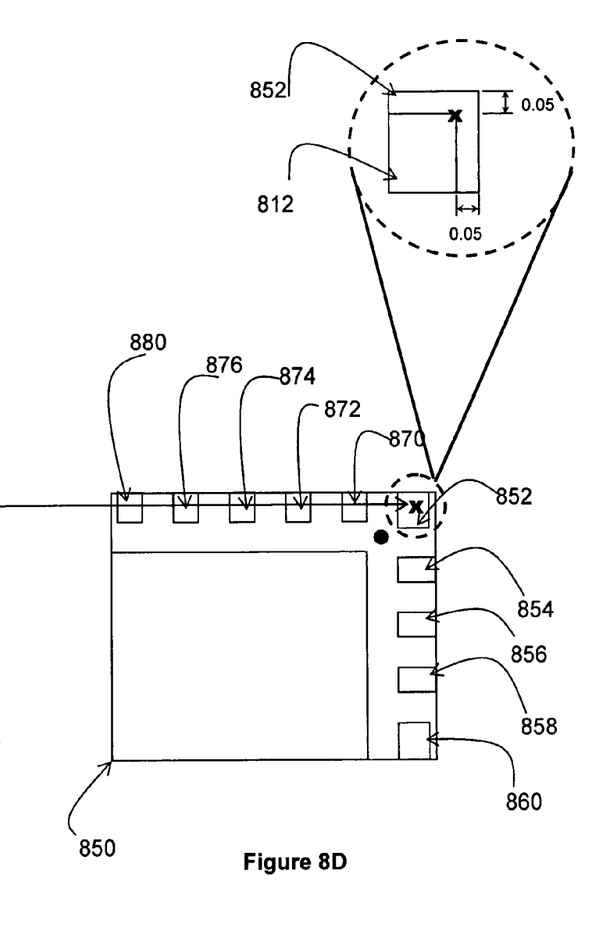
Figure 9A:
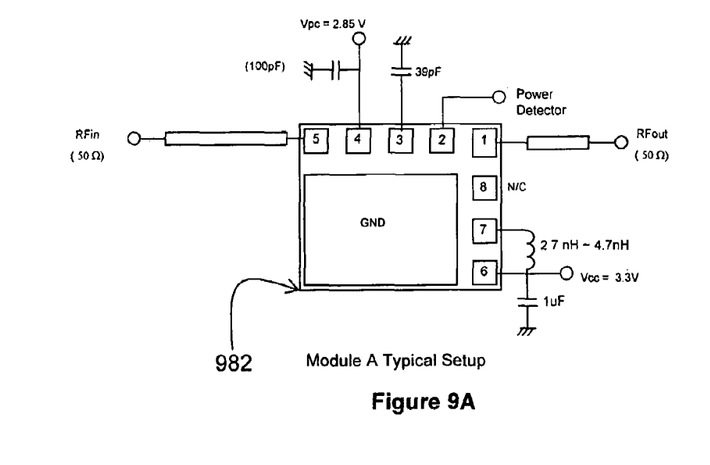
FIGS. 9A-9B show exemplary electrical set-ups for the devices of FIGS. 8A-8B.
Figure 9B:
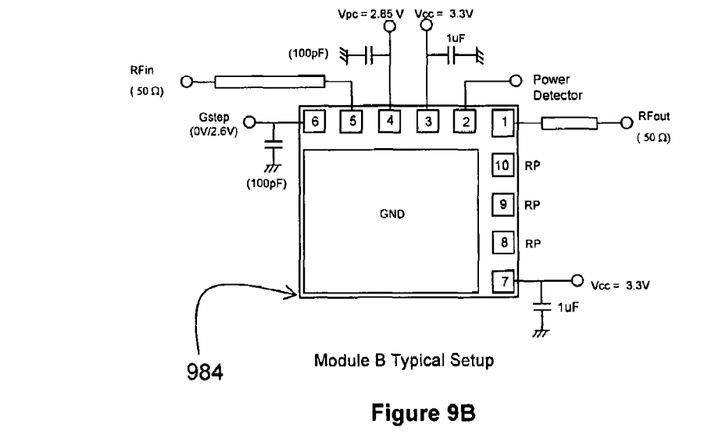

FIGS. 8A-8B and 8C-8D show two exemplary devices that are foot-print compatible, while FIGS. 9A-9B show exemplary electrical set-ups for the devices of FIGS. 8A-8D. In both devices, first and second rows of pads are positioned on adjacent sides of the module and intersect at a corner pad (pad 812 for device 810 and pad 852 for device 850). The first and second rows of pads are connected to first and second power amplifiers and first and second bias circuits. The printed circuit board layout supports a contiguous subset of the first and second rows of pads that can accept an interchangeable substitute device such as a cost reduced device. Thus, the devices of FIGS. 8A and 8C can be used in one design whose printed circuit board conforms to the foot print of the device of FIGS. 8B and 8D and vice versa.

To further illustrate, in FIG. 8C, the device 810 has a corner pad 812 that is situated at one corner of the device 810. From the pad 812, a plurality of pads 814, 816 and 818 are positioned on one side of the device 810. Further, from the pad 812, a plurality of pads 820, 822, 824 and 826 are positioned on an adjacent side. Similarly, in FIG. 8D, a device 850 has a corner pad 852 that is situated at one corner of the device 850. From the pad 852, a plurality of pads 854, 856, 858 and 860 are positioned on one side of the device 850. Further, from the pad 852, a plurality of pads 870, 872, 874, 876 and 880 are positioned on an adjacent side.

In a design whose printed circuit board conforms to the footprint of FIG. 8D, pads 812 or 852 shares a common position on the printed circuit board. The two devices 810 and 850 are interchangeable in that pads on the same offset from the corner pad 812 or 852 are electrically compatible. In one embodiment, pads 812 and 852 carry or connect to the same first signal. Similarly, pads 820 and 870 carry the same fifth signal, pads 822 and 872 carry the same sixth signal, pads 824 and 874 carry the same seventh signal, pads 826 and 876 carry the same eight signal, and pad 880 carries or conduct a new signal that is available for the device 850 but is not available or present in the device 810.

In one exemplary implementation, the first module 810 has a first side approximately 1.7 mm in width and a second side approximately 2.1 mm in length, and a ground plane with dimensions of approximately 1.25 mm by 1.6 mm, wherein each pad comprises approximately 0.2 mm×0.2 mm, wherein each pad is spaced apart from each other by approximately 0.45 mm from center to center with a first ground plane spaced apart from the pads by approximately 0.25 mm. One implementation of the second module 850 has a first side approximately 2.2 mm in width and a second side approximately 2.6 mm in length, and a ground plane with dimensions of approximately 2.05 mm by 1.7 mm, wherein each pad comprises approximately 0.2 mm×0.25 mm, wherein each pad is spaced apart from each other by approximately 0.45 mm from center to center with a second ground plane spaced apart from the pads by approximately 0.25 mm. The corner pads could be slightly larger than non-corner pads for producibility reasons. In this embodiment, the pad size of the first module is 0.05 mm smaller than the second module in both the X-axis and the Y-axis dimension. Accordingly, the first and second corner pad centers are positioned at an alignment offset of 0.05 mm when the corner pads are superimposed along the X-axis and Y-axis directions. In the situation when the pad size of the first module is the same as the pad size of second module, then no alignment offset is needed.

FIGS. 9A-9B show exemplary electrical setup configurations for two devices or modules 982-984 that are interchangeable and interoperable. As shown therein, pad 1 is the corner pad for both devices and provides the RF output for the devices 982 and 984, and pad 5 is the RF input pad for both devices. Hence, pads 1 and 5 define a row for devices 982 and 984. As pad 5 occupies the same offset distance from pad 1, the devices can be substituted for each other. Further, along the row of pads defined by pads 1 and 5, various power amplifier control input pads such as a bias control terminal, a power control terminal, and a power sensor output terminal are positioned. Additionally, the column of pads between pads 1 and pad 6 of device 982 provide DC power input pads for the device 982. However, the position of the power pads can shift without affecting the interchangeability of the devices 982 and 984.

Figure 10A:
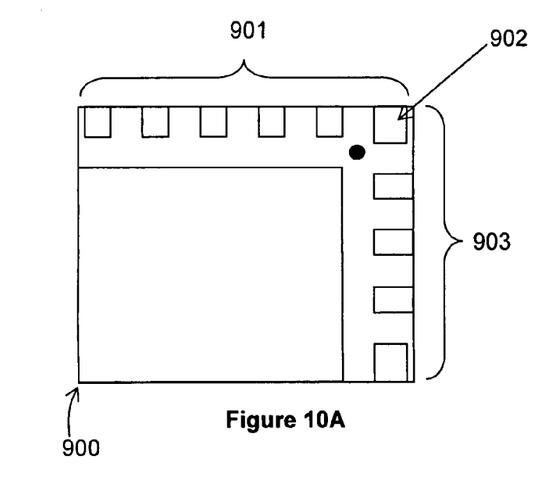
FIGS. 10A, 10B and 10C illustrate various modules mounted on printed circuit board layouts.
Figure 10B:
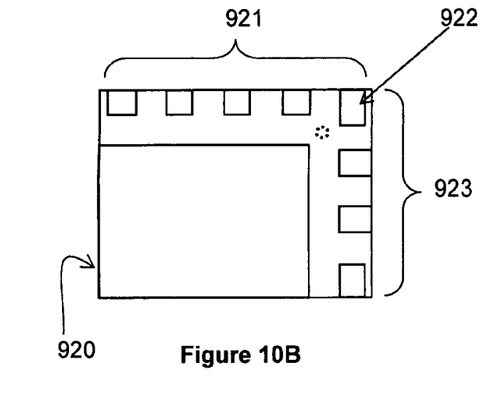
Figure 10C:
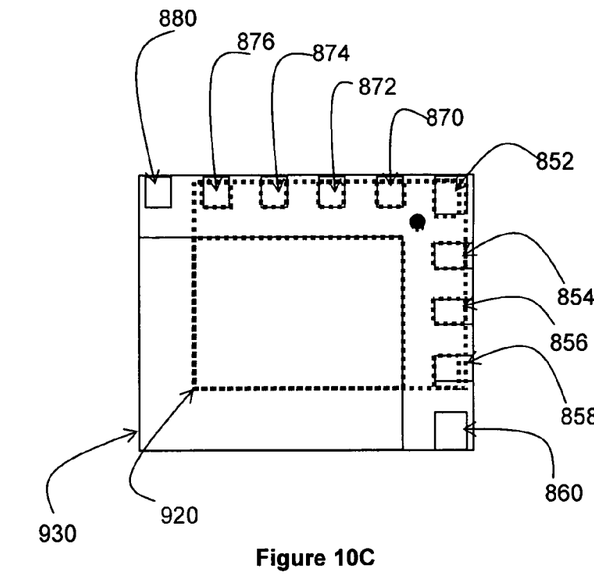

FIGS. 10A, 10B and 10C illustrate various modules mounted on printed circuit board layouts. FIG. 10A is the footprint of the large module 900 and FIG. 10B is the footprint of the smaller module. As, illustrated in FIG. 10C, the PCB layout 930 can accept both modules 900 and 920.

The modules 900 and 920 form a system of compatible modules. The module 920 is the first module where a first row and first column of pads intersects at a corner pad of the first module 922. The first row 921 and column 923 of pads are electrically coupled to a power amplifier (not shown) and the pads are separated by a predetermined pad spacing. Correspondingly, the second module 900 including second row 901 and column 903 of pads intersecting at a second corner pad 902 of the second module 900 with the predetermined pad spacing such that the second module 900 is physically interchangeable and electrically substitutable with the first module 920.

As illustrated in FIG. 10C, the device 900 is interchangeable with the device 920 in that, when a printed circuit board contains PCB pads that can receive the device 900, the same PCB pads can also accept a substitute device 920. In this manner, a lower cost device can be used in place of a higher cost device using the same PCB layout. The decision for using a particular device can be delayed until the late during the manufacturing phase (just before soldering the device on a PCB). Such flexibility allows a manufacturer to quickly customize a particular product for performance or for low cost. Although one set of exemplary dimensions are described in the description and in the drawings, other suitable dimensions can be used. Also, the system includes more than two devices. For example, from one to ten interchangeable devices can be offered by the system.

Although specific embodiments of the present invention have been illustrated in the accompanying drawings and described in the foregoing detailed description, it will be understood that the invention is not limited to the particular embodiments described herein, but is capable of numerous rearrangements, operating frequency bands, modifications, and substitutions without departing from the scope of the invention. For example, the frequency of a power amplifier is not restricted to 2.5 GHz or 3.5 GHz. The described system is compatible with power amplification at 400 MHz, 700 MHz, 1-5 GHz, or any other radio frequencies. The following claims are intended to encompass all such modifications.

What is claimed is:

1. A radio frequency (RF) module, comprising:
   a power amplifier configured to produce an amplified RF signal at an output RF terminal; and
   a row of pads and a column of pads intersecting at a corner pad of the module, and wherein the corner pad is coupled to the output RF terminal, wherein the pads comprise a foot-print compatible with a second RF module having a different number of pads when the modules are aligned at a corner pad.

2. The RF module of claim 1, wherein the input and output terminals are positioned on the row of pads.

3. The RF module of claim 1, wherein the row of pads comprises an RF input terminal, a bias control terminal, a power control terminal, a power sensor output terminal, an RF output terminal.

4. The RF module of claim 1, comprising a ground plane adjacent to the row and column of pads.

5. The RF module of claim 1, wherein the column of pads comprises one or more power supply input terminals.

6. The module of claim 1, wherein the second RF module comprises a second power amplifier having an RF output coupled to a corner pad of the second RF module.

7. The module of claim 6, wherein the power amplifier and the second power amplifier receive RF inputs from corresponding RF input pads occupying the same offset from the corner pad when the modules are aligned at the corner pad.

8. The RF module of claim 6, wherein the second RF module has a different number of pads than the first module and wherein the row and column of pads of the second RF module physically correspond to the row and column of pads of the RF module.

9. The RF module of claim 6, wherein the second RF module is interchangeable with the RF module with an identical inter-pad spacing.

10. The RF module of claim 1, wherein the power amplifier comprising a power control terminal, a power detector terminal, and a gain step control terminal.

11. The RF module of claim 1, comprising a matching network coupled to one of: an RF input terminal, an RF output terminal. , 12. The RF module of claim 1, comprising a first side approximately 1.7 mm in width and a second side approximately 2.1 mm in length.

13. The RF module of claim 1, comprising a first side approximately 2.2 mm in width and a second side approximately 2.6 mm in length.

14. The RF module of claim 1, wherein each pad is spaced apart from each other by approximately 0.45 mm from center to center.

15. The RF module of claim 1, comprising a ground plane with dimensions of at least approximately 1.6 mm by 1.25 mm.

16. The RF module of claim 15, wherein the ground plane is spaced apart from the pads by approximately 0.25 mm.

17. The module of claim 1, wherein the pad comprises a dimension of: 0.2 mm by 0.2 mm, 0.2 mm by 0.25 mm, 0.2 mm by 0.3 mm.

18. The module of claim 1, wherein the pads form an L-shape.

19. A system of compatible modules, comprising:
   a first module including a first row and first column of pads intersecting at a corner pad of the first module, said first row and column of pads coupled to a power amplifier and the pads being separated by a predetermined pad spacing; and
   a second module including second row and column of pads intersecting at a second corner pad of the second module with the predetermined pad spacing such that the second module is physically interchangeable and electrically substitutable with the first module.

* * * * *